(12) United States Patent
Park

(10) Patent No.: US 8,767,500 B2
(45) Date of Patent: Jul. 1, 2014

(54) BUFFER CIRCUIT AND WORD LINE DRIVER USING THE SAME

(75) Inventor: Sang Il Park, Suwon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 58 days.

(21) Appl. No.: 13/489,562

(22) Filed: Jun. 6, 2012

(65) Prior Publication Data
US 2013/0148458 A1 Jun. 13, 2013

(30) Foreign Application Priority Data

Dec. 9, 2011 (KR) .................. 10-2011-0131650

(51) Int. Cl.
*G11C 8/00* (2006.01)
(52) U.S. Cl.
USPC ............................ 365/230.06; 365/189.05

(58) Field of Classification Search
USPC ........................................ 365/230.06, 189.05
See application file for complete search history.

(56) References Cited

U.S. PATENT DOCUMENTS 6,515,893 B1 * 2/2003 Bhavnagarwala ............ 365/154

FOREIGN PATENT DOCUMENTS

KR 100801059 B1 1/2008

* cited by examiner

*Primary Examiner* — Huan Hoang
(74) *Attorney, Agent, or Firm* — William Park & Associates Patent Ltd.

(57) ABSTRACT

A buffer circuit includes a pull-up element configured to pull-up drive a first node through which an output signal is outputted, in response to an input signal; a first voltage control element configured to reduce a voltage of the first node and set a voltage of a second node in a standby mode; and a pull-down element configured to pull-down drive the second node in response to the input signal.

17 Claims, 3 Drawing Sheets

|  | Standby Mode | | Active Mode | |
|---|---|---|---|---|
| IN | VBBW | -0.2(V) | VPP | 2.9(V) |
| OUT | VPP | 2.9(V) | VBBW | -0.2(V) |
| VDG | VPP-VBBW | 3.1(V) | VBBW-VPP | -3.1(V) |

|  | Standby Mode | | Active Mode | |
| --- | --- | --- | --- | --- |
| IN | VBBW | -0.2(V) | VPP | 2.9(V) |
| OUT | VPP | 2.9(V) | VBBW | -0.2(V) |
| nd11 | VBBW | -0.2(V) | VDD-VTH11 | 1.34(V) |
| nd13 | VDD-VTH12 | 1.34(V) | VBBW | -0.2(V) |
| VDGN | VPP-VTH12-VBBW | 1.54(V) | VBBW-(VDD-VTH11) | -1.54(V) |

BUFFER CIRCUIT AND WORD LINE DRIVER USING THE SAME

CROSS-REFERENCES TO RELATED APPLICATIONS

The present application claims priority under 35 U.S.C 119(a) to Korean Patent Application No. 10-2011-0131650, filed on Dec. 9, 2011, in the Korean Intellectual Property Office, which is incorporated herein by reference in its entirety as set forth in full.

BACKGROUND

In general, a semiconductor memory device is supplied with a power supply voltage (VDD) and a ground voltage (VSS) from an outside source, and generates and uses internal voltages which are necessary for internal operations. Voltages necessary for internal operations of a memory device include a core voltage (VCORE) supplied to a memory core region, a boosted voltage (VPP) used for driving or overdriving of a word line, and a reduced voltage (VBBW) supplied as a bulk voltage of a MOS transistor.

While the core voltage (VCORE) may be supplied by reducing a power supply voltage (VDD) inputted from an outside source to a predetermined level, because the boosted voltage (VPP) is a voltage with a higher level than the power supply voltage (VDD) inputted from the outside source and the reduced voltage (VBBW) is a voltage with a lower level than the ground voltage (VSS), a charge pump circuit is needed to supply charges to the boosted voltage (VPP) and the reduced voltage (VBBW).

As a semiconductor memory device trends toward high integration and high capacity, the thickness of a MOS transistor and the thickness of a gate oxide layer (SiO2) gradually decrease. On the contrary, since a boosted voltage (VPP) is still maintained high, the intensity of an electric field which is applied to the gate of a MOS transistor using the boosted voltage (VPP) is substantial. Accordingly, in a MOS transistor, GIDL (gate induced drain leakage) gradually increases which typically causes characteristics and productivity of the semiconductor memory device to deteriorate.

FIG. 1 is a circuit diagram of a conventional buffer circuit.

Referring to FIG. 1, the conventional buffer circuit includes a PMOS transistor P100 configured to pull-up drive a node nd100, from which an output signal OUT is outputted, with a boosted voltage VPP in response to an input signal IN. The conventional buffer circuit also includes an NMOS transistor N100 configured to pull-down drive the node nd100 with a reduced voltage VBBW in response to the input signal IN.

Operations of the conventional buffer circuit configured in this way will be described with reference to FIG. 2, by being divided into a standby mode in which the input signal IN is applied as the reduced voltage VBBW, and an active mode in which the input signal IN is applied as the boosted voltage VPP.

In the standby mode, the PMOS transistor P100 is turned on by the input signal IN applied as the reduced voltage VBBW, and the node nd100 is pull-up driven by the boosted voltage VPP. Accordingly, a voltage difference VDG between the drain and the gate of the NMOS transistor N100, which is turned off, is induced largely by the difference between the boosted voltage VPP and the reduced voltage VBBW. For example, when a semiconductor memory device in which the reduced voltage VBBW is set to –0.2V and the boosted voltage VPP is set to 2.9V, the voltage difference between the drain and the gate of the NMOS transistor N100 reaches 3.1V. Therefore, an amount of leakage current in the NMOS transistor N100 abruptly increases due to GIDL. Also, the voltage difference between the drain and the source of the NMOS transistor N100 increases, which causes an amount of leakage current due to channel-off leakage to increase.

In the active mode, the NMOS transistor N100 is turned on by the input signal IN applied as the boosted voltage VPP, and the node nd100 is pull-down driven by the reduced voltage VBBW. At this time, since the boosted voltage VPP is applied to the gate of the NMOS transistor N100, the NMOS transistor N100 should be formed in such a manner that a gate oxide layer has a thickness larger than a predetermined thickness. As the gate oxide layer of the NMOS transistor N100 is formed to be thicker, an operating speed in the active mode decreases.

SUMMARY

Embodiments of the present invention relate to a buffer circuit which can reduce voltage differences between the gate and the drain and between the drain and the source of a MOS transistor in a standby mode, thereby decreasing an amount of leakage current, and a word line driver using the same.

Other embodiments of the present invention relate to a buffer circuit which can reduce a voltage applied to the gate of a MOS transistor in an active mode, thereby improving an operation speed, and a word line driver using the same.

In one embodiment, a buffer circuit includes: a pull-up element configured to pull-up drive a first node through which an output signal is outputted, in response to an input signal; a first voltage control element configured to reduce a voltage of the first node and set a voltage of a second node in a standby mode; and a pull-down element configured to pull-down drive the second node in response to the input signal.

In another embodiment, a word line driver includes: an address input unit configured to be inputted with an address decoding signal in response to a word line off signal and drive a first node; a level setting unit configured to set a level of a second node in response to a signal of the first node; and a buffer circuit configured to buffer a signal of the second node and generate a word line signal, wherein the buffer circuit includes a pull-up element configured to pull-up drive a third node through which the word line signal is outputted, in response to the signal of the second node, a first voltage control element configured to reduce a voltage of the third node and set a voltage of a fourth node in a standby mode, and a pull-down element configured to pull-down drive the fourth node in response to the signal of the second node.

BRIEF DESCRIPTION OF THE DRAWINGS

The above and other aspects, features and other advantages will be more clearly understood from the following detailed descriptions taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit a scope of the invention.

Figures 1, 2:
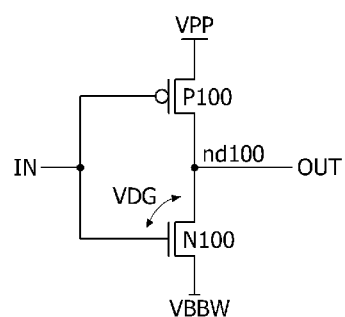
FIG. 1 is a circuit diagram of a conventional buffer circuit.
FIG. 2 is a table showing voltages of the internal nodes included in the buffer circuit shown in FIG. 1.
Figures 3, 4:
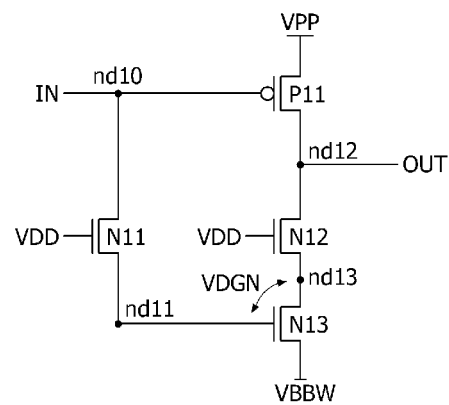
FIG. 3 is a circuit diagram of a buffer circuit in accordance with an embodiment of the present invention.
FIG. 4 is a table showing voltages of the internal nodes included in the buffer circuit shown in FIG. 3.

FIG. 3 is a circuit diagram of a buffer circuit in accordance with an embodiment of the present invention.

Referring to FIG. 3, the buffer circuit in accordance with the present embodiment includes an NMOS transistor N11 which is connected between a node nd10 and a node nd11. The NMOS transistor N11 is turned on by an applied power supply voltage VDD, and the NMOS transistor N11 serves as a voltage control element. The buffer circuit may also include a PMOS transistor P11 which serves as a pull-up element for pull-up driving a node nd12 to a boosted voltage VPP in response to an input signal IN, where an output signal OUT may be outputted through the node nd12. The buffer circuit may further include an NMOS transistor N12 which is connected between the node nd12 and a node nd13, the NMOS transistor N12 may be turned on by the applied power supply voltage VDD, and the NMOS transistor N12 may serve as a voltage control element. The buffer circuit may also include an NMOS transistor N13 which is connected between the node nd13 and a reduced voltage VBBW, and the NMOS transistor N13 may serve as a pull-down element for pull-down driving the node nd13 in response to the signal of the node nd11. The gate oxide layer of the NMOS transistor N13 may be thinner than the NMOS transistor N11 and the NMOS transistor N12.

Operations of the buffer circuit configured in this way will be described with reference to FIG. 4. The operations are described in terms of a standby mode and an active mode. In the standby mode the input signal IN is applied as the reduced voltage VBBW. In the active mode the input signal IN is applied as the boosted voltage VPP.

In the standby mode, the PMOS transistor P11 is turned on by the input signal IN applied as the reduced voltage VBBW, and the node nd12 is pull-up driven to the boosted voltage VPP. The voltage of the node nd11 is driven by the NMOS transistor N11 to the reduced voltage VBBW which is the same as the input signal IN. The voltage of the node nd13 is set by the NMOS transistor N12 to the voltage difference between the power supply voltage VDD and a threshold voltage VTH12 of the NMOS transistor N12. In other words, the voltage of the node nd13 is set to 1.34V by the NMOS transistor N12 serving as a voltage control element which has a lower level than the node nd12 driven to 2.9V, and is applied to the drain of the NMOS transistor N13. Accordingly, a voltage difference VDGN between the drain and the gate of the NMOS transistor N13 becomes 1.54V which is lower than in the conventional art, which leads to a reduction in current leakage caused by GIDL. Also, the voltage difference between the drain and the source of the NMOS transistor N13 reduces an amount of current leakage due to channel-off leakage.

In the active mode, since the input signal IN is applied as the boosted voltage VPP, the node nd11 is set to the voltage difference between the power supply voltage VDD and a threshold voltage VTH11 of the NMOS transistor N11. Accordingly, a voltage of the node nd11 is set to 1.34V and is applied to the gate of the NMOS transistor N13 serving as a pull-down element. When compared to the conventional buffer circuit, because the voltage applied to the gate of the pull-down element is reduced from 2.9V to 1.34V, the gate oxide layer of the NMOS transistor N13 may be thinner than a gate oxide layer found in, for example, NMOS transistor N11 and N12, and because the gate oxide layer of the NMOS transistor N13 may be thinner, an operating speed may be improved.

Figure 5:
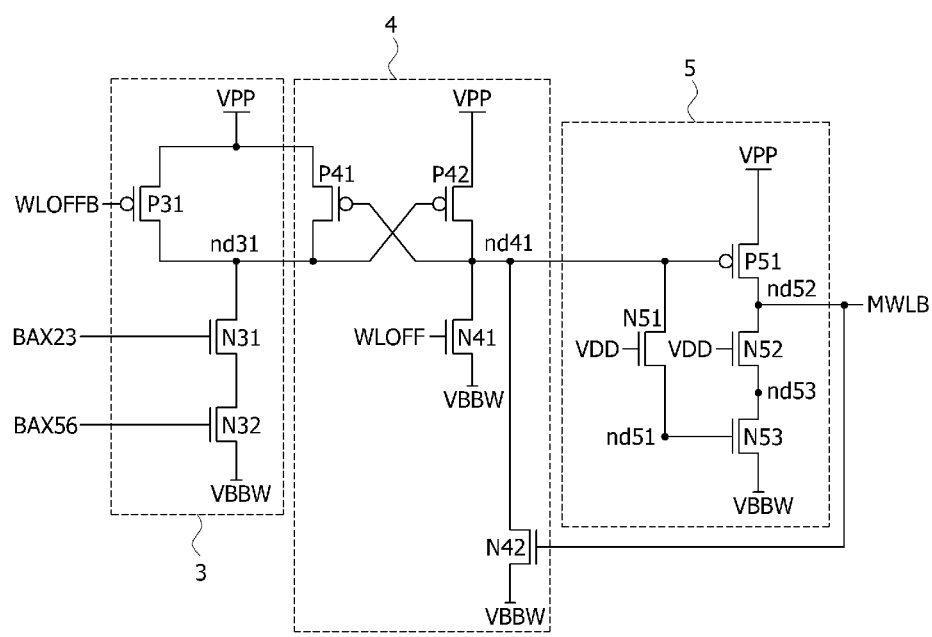
FIG. 5 is a circuit diagram of a word line driver in accordance with another embodiment of the present invention.

FIG. 5 is a circuit diagram of a word line driver in accordance with another embodiment of the present invention.

Referring to FIG. 5, the word line driver in accordance with an embodiment includes an address input unit 3, a level setting unit 4, and a buffer circuit 5.

The address input unit 3 includes a PMOS transistor P31 which is connected between a boosted voltage VPP and a node nd31 and drives the node nd31 to the boosted voltage VPP in response to an inverted word line off signal WLOFFB. The address input unit 3 may also include NMOS transistors N31 and N32, which are connected between the node nd31 and a reduced voltage VBBW, that drive the node nd31 to the reduced voltage VBBW in response to address decoding signals BAX23 and BAX56. The inverted word line off signal WLOFFB is a signal which is enabled to a logic low level in the standby mode, and the address decoding signals BAX23 and BAX56 are signals which are generated by decoding the row addresses inputted to activate word lines in the active mode. The address input unit 3 configured in this way drives the node nd31 to the boosted voltage VPP in the standby mode and drives the node nd31 to the reduced voltage VBBW in the active mode.

The level setting unit 4 includes a PMOS transistor P41 which drives the node nd31 to the boosted voltage VPP in response to the signal of a node nd41, a PMOS transistor P42 which drives the node nd41 to the boosted voltage VPP in response to the signal of the node nd31, an NMOS transistor N41 which drives the node nd41 to the reduced voltage VBBW in response to a word line off signal WLOFF, and an NMOS transistor N42 which drives the node nd41 to the reduced voltage VBBW in response to a word line signal MWLB. The word line off signal WLOFF is a signal which is enabled to a logic high level in the standby mode, and the word line signal MWLB is a signal which is enabled to a logic low level to activate a main word line in the active mode. The level setting unit 4 configured in this way drives the node nd41 to the reduced voltage VBBW in the standby mode and drives the node nd41 to the boosted voltage VPP in the active mode.

The buffer circuit 5 includes an NMOS transistor N51, which is connected between the node nd41 and a node nd51, that is applied with a power supply voltage VDD to turn on the NMOS transistor N51, and the NMOS transistor N51 serves as a voltage control element. The buffer circuit 5 may also include a PMOS transistor P51 which serves as a pull-up element for pull-up driving a node nd52 to the boosted voltage VPP for outputting the word line signal MWLB in response to the signal of the node nd41. The buffer circuit 5 may further include an NMOS transistor N52, which is connected between the node nd52 and a node nd53, that is applied with the power supply voltage VDD to be turned on and serves as a voltage control element. The buffer circuit 5 may also include an NMOS transistor N53 which is connected between the node nd53 and the reduced voltage VBBW and serves as a pull-down element for pull-down driving the node nd53 in response to the signal of the node nd51. The gate oxide layer of the NMOS transistor N53 may be thinner than the gate oxide layers of NMOS transistors N51 and N52.

Hereafter, operations of the word line driver in the standby mode will be described.

First, in the standby mode, the address input unit 3 is inputted with the inverted word line off signal WLOFFB which is enabled to the logic low level, and drives the node nd31 to the boosted voltage VPP. The level setting unit 4 is inputted with the word line off signal WLOFF which is enabled to the logic high level, and drives the node nd41 to the reduced voltage VBBW.

Next, the buffer circuit 5 drives the word line signal MWLB to the boosted voltage VPP in response to the signal of the node nd41. In detail, the PMOS transistor P51 is turned on by the signal of the node nd41 which is driven to the reduced voltage VBBW, and the node nd52 is pull-up driven to the boosted voltage VPP. The voltage of the node nd51 is driven by the NMOS transistor N51 to the reduced voltage VBBW which is the same as the input signal IN. The voltage of the node nd53 is set by the NMOS transistor N52 to the voltage difference between the power supply voltage VDD and the threshold voltage of the NMOS transistor N52. Because the voltage applied to the drain of the NMOS transistor N53 is reduced through the NMOS transistor N52, the voltage difference between the drain and the gate of the NMOS transistor N53 and the voltage difference between the drain and the source of the NMOS transistor N53 are reduced. Accordingly, in the NMOS transistor N53 turned off in the standby mode, there is a reduction in current leakage due to GIDL and channel-off leakage.

Hereinbelow, operations of the word line driver in the active mode will be described.

First, in the active mode, the address input unit 3 is inputted with the address decoding signals BAX23 and BAX56 which are enabled to logic high levels, and drives the node nd31 to the reduced voltage VBBW.

The level setting unit 4 drives the node nd41 to the boosted voltage VPP by the PMOS transistor P42 which is turned on by the signal of the node nd31 having the reduced voltage VBBW.

The buffer circuit 5 drives the word line signal MWLB to the reduced voltage VBBW in response to the signal of the node nd41. In detail, in the active mode, because the signal of the node nd41 is applied as the boosted voltage VPP, the node nd51 is set to the voltage difference between the power supply voltage VDD and the threshold voltage of the NMOS transistor N51 and the voltage of the node nd51 is applied to the gate of the NMOS transistor N53 which serves as a pull-down element. Accordingly, the word line signal MWLB is driven to the reduced voltage VBBW by the NMOS transistors N52 and N53 which are turned on. Because the voltage applied to the gate of the NMOS transistor N53 serving as a pull-down element is set low by the NMOS transistor N51, the gate oxide layer of the NMOS transistor N53 may be formed thinner than the gate oxide layers of NMOS transistors N51 and N52, and because of this, an operating speed may be improved.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:
1. A buffer circuit comprising:
   a pull-up element configured to pull-up drive a first node through which an output signal is outputted, in response to an input signal;
   a first voltage control element configured to reduce a voltage of the first node and set a voltage of a second node in a standby mode; and
   a pull-down element configured to pull-down drive the second node in response to the input signal, wherein, in the standby mode, the input signal is set to a level that turns on the pull-up element and turns off the pull-down element.
2. The buffer circuit according to claim 1, wherein, in the standby mode, the input signal is inputted as a reduced voltage with a lower level than a ground voltage, and the first node is driven to a boosted voltage with a higher level than a power supply voltage.
3. The buffer circuit according to claim 1, wherein the pull-down element has a gate oxide layer which is formed thinner than the first voltage control element.
4. The buffer circuit according to claim 1, further comprising:
   a second voltage control element configured to reduce a voltage of the input signal and set a voltage of a third node which is applied to a gate of the pull-down element, in an active mode.
5. The buffer circuit according to claim 4, wherein the pull-down element has a gate oxide layer which is formed thinner than the second voltage control element.
6. The buffer circuit according to claim 4, wherein, in the active mode, the input signal is set to a level that turns off the pull-up element and turns on the pull-down element.
7. The buffer circuit according to claim 6, wherein, in the active mode, the input signal is inputted as a boosted voltage with a higher level than a power supply voltage.
8. A word line driver comprising:
   an address input unit configured to be inputted with an address decoding signal in response to a word line off signal and drive a first node;
   a level setting unit configured to set a level of a second node in response to a signal of the first node; and
   a buffer circuit configured to buffer a signal of the second node and generate a word line signal,
   wherein the buffer circuit comprises a pull-up element configured to pull-up drive a third node through which the word line signal is outputted, in response to the signal of the second node, a first voltage control element configured to reduce a voltage of the third node and set a voltage of a fourth node in a standby mode, and a pull-down element configured to pull-down drive the fourth node in response to the signal of the second node, wherein the address input unit pull-up drives the first node in response to the word line off signal which is enabled in the standby mode, and pull-down drives the first node in response to the address decoding signal in an active mode.
9. The word line driver according to claim 8, wherein the address input unit drives the first node to a boosted voltage with a higher level than a power supply voltage in the standby mode and drives the first node to a reduced voltage with a lower level than a ground voltage.
10. The word line driver according to claim 8, wherein the level setting unit pull-down drives the second node in response to the word line off signal which is enabled in the standby mode, and pull-up drives the second node in response to the signal of the first node in an active mode.
11. The word line driver according to claim 10, wherein the level setting unit drives the second node which is enabled in the standby mode, to a reduced voltage with a lower level than a ground voltage, and drives the second node to a boosted voltage with a higher level than a power supply voltage in the active mode.
12. The word line driver according to claim 8, wherein the pull-down element has a gate oxide layer which is formed thinner than the first voltage control element.
13. The word line driver according to claim 8, further comprising:
   a second voltage control element configured to reduce a voltage of the input signal and set a voltage of a fifth node which is applied to a gate of the pull-down element, in the active mode.

14. The word line driver according to claim 13, wherein the pull-down element has a gate oxide layer which is formed thinner than the second voltage control element.

15. The word line driver according to claim 8, wherein, in the active mode, the signal of the second node is set to a level that turns off the pull-up element and turns on the pull-down element.

16. The word line driver according to claim 8, wherein, a voltage of the fourth node is set by the first voltage control element to a voltage difference between a power supply voltage and a threshold voltage of the first voltage control element.

17. The word line driver according to claim 8, wherein, voltage applied to a drain of the pull-down element is reduced through the first voltage control element.

* * * * *